United States Patent
Wang et al.

(10) Patent No.: US 6,840,971 B2
(45) Date of Patent: Jan. 11, 2005

(54) CHEMICAL MECHANICAL POLISHING SYSTEMS AND METHODS FOR THEIR USE

(75) Inventors: Shumin Wang, Naperville, IL (US); Vlasta Brusic Kaufman, Geneva, IL (US)

(73) Assignee: Cabot microelectronics Corporation, Aurora, IL (US)

( * ) Notice: Subject to any disclaimer, the term of this patent is extended or adjusted under 35 U.S.C. 154(b) by 0 days.

(21) Appl. No.: 10/324,634

(22) Filed: Dec. 19, 2002

(65) Prior Publication Data

US 2003/0166337 A1 Sep. 4, 2003

Related U.S. Application Data

(63) Continuation of application No. 09/625,568, filed on Jul. 26, 2000, now abandoned.
(60) Provisional application No. 60/148,878, filed on Aug. 13, 1999.

(51) Int. Cl.[7] .............................. B24D 3/02; C09C 1/68; C09K 3/14
(52) U.S. Cl. ........................ 51/307; 438/691; 438/692; 438/693
(58) Field of Search ........................... 51/307; 438/690, 438/691–693

(56) References Cited

U.S. PATENT DOCUMENTS 5,532,191 A * 7/1996 Nakano et al. ............. 437/228
6,083,419 A * 7/2000 Grumbine et al. .......... 252/79.1
6,117,775 A * 9/2000 Kondo et al. ................ 438/690
6,136,711 A * 10/2000 Grumbine et al. .......... 438/692
6,136,714 A * 10/2000 Schutz ........................ 438/692
6,171,352 B1 * 1/2001 Lee et al. ...................... 51/307
6,194,317 B1 * 2/2001 Kaisaki et al. .............. 438/692

FOREIGN PATENT DOCUMENTS

| EP | 0 659 858 A2 | 6/1995 | ............ C09G/1/02 |
| EP | 0 659 858 A3 | 1/1997 | ......... H01L/31/321 |
| EP | 0 846 742 A2 | 6/1998 | ............ C09G/1/02 |
| EP | 0 846 742 A3 | 10/1998 | ............ C09G/1/02 |
| EP | 0 984 049 A1 | 3/2000 | ............ C09G/1/02 |
| JP | 49030330 A * | 3/1974 | |
| JP | 2000160141 A * | 6/2000 | ............ C09K/3/14 |
| WO | WO 99/47618 | 9/1999 | ............ C09G/1/02 |
| WO | WO 99/53532 | 10/1999 | ........... H01L/21/00 |

OTHER PUBLICATIONS

Lewis; Hawley's Condensied Chemical Dictionary, 13th edition, 1997, p. 545.*

* cited by examiner

*Primary Examiner*—Duy-Vu Deo
(74) *Attorney, Agent, or Firm*—A. Blair Hughes

(57) ABSTRACT

Alpha-amino acid containing chemical mechanical polishing compositions and slurries that are useful for polishing substrates including multiple layers of metals, or metals and dielectrics.

12 Claims, No Drawings

CHEMICAL MECHANICAL POLISHING SYSTEMS AND METHODS FOR THEIR USE

This application is a CON of application Ser. No. 09/625,568, filed Jul. 26, 2000 now abandoned, which claimed benefit of provisional patent application No. 60/148,878, filed Aug. 13, 1999.

BACKGROUND OF THE INVENTION (1) Field of the Invention

This invention concerns alpha-amino acid containing chemical mechanical polishing compositions and slurries that are useful for polishing substrates including multiple layers of metals, or metals and dielectrics.

(2) Description of the Art

Integrated circuits are made up of millions of active devices formed in or on a semiconductor substrate such as a silicon semiconductor wafer. The active devices, which are initially isolated from one another, are interconnected through the use of multilevel interconnections to form functional circuits and components. Interconnection structures normally have a first level of metallization, an interlevel dielectric layer, a second level of metallization, and sometimes a third and subsequent levels of metallization. Interlevel dielectrics such as doped and undoped silicon dioxide ($SiO_2$) and low-κ dielectrics are used to electrically isolate the different levels of metallization in a semiconductor substrate or well. The electrical connections between different interconnection levels are made through the use of metallized vias. U.S. Pat. No. 5,741,626, which is incorporated herein by reference, describes a method for preparing dielectric tantalum nitride layers.

In a similar manner, metal contacts are used to form electrical connections between interconnection levels and devices formed in a well. The metal vias and contacts may be filled with various metals and alloys including titanium (Ti), titanium nitride (TiN), tantalum (Ta), tantalum nitride (TaN), aluminum copper (Al—Cu), aluminum silicon (Al—Si), copper (Cu), tungsten (W), tungsten nitride, and combinations thereof. The metal vias and contacts generally employ an adhesion layer such as titanium nitride (TiN), titanium (Ti), tantalum (Ta), tantalum nitride (TaN), tungsten, tungsten nitride, or combinations thereof to adhere the metal layer to the dielectric layer. At the contact level, the adhesion layer acts as a diffusion barrier to prevent the filled metal and dielectric layers from reacting. Processes for manufacturing and/or CMP of vias are disclosed in U.S. Pat. Nos. 4,671,851, 4,910,155 and 4,944,836.

In a typical chemical mechanical polishing process, the semiconductor wafer is placed in contact with a polishing pad. The pad and table are rotated while a downward force is applied to the backside of the semiconductor wafer. An abrasive containing chemically reactive solution, commonly referred to as a "slurry," is applied to the pad during polishing. The polishing process is facilitated by the rotational movement of the pad relative to the substrate as slurry is provided to the wafer/pad interface. Polishing is continued in this manner until the desired film thickness on the insulator is removed. The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride, tantalum, tantalum nitride, tungsten, tungsten nitride, and the like.

Typically, CMP polishing slurries contain an abrasive material, such as silica or alumina, suspended in an oxidizing aqueous medium. For example, U.S. Pat. No. 5,244,534 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium that is useful for polishing aluminum. U.S. Pat. No. 5,340,370 to Cadien et al. discloses a tungsten polishing slurry comprising approximately 0.1M potassium ferricyanide, approximately 5 weight percent silica and potassium acetate. Acetic acid is added to buffer the pH at approximately 3.5.

U.S. Pat. No. 4,789,648 to Beyer et al. discloses a slurry formulation using alumina abrasives in conjunction with sulfuric, nitric, and acetic acids and deionized water. U.S. Pat. Nos. 5,391,258 and 5,476,606 disclose slurries for polishing a composite of metal and silica which include an aqueous medium, abrasive particles and an anion which controls the rate of silica removal. U.S. Pat. No. 5,770,095 discloses polishing slurries including a chemical agent and an etching agent selected from aminoacetic acid, and amidosulfuric acid along with an oxidizing agent. Other polishing slurries for use in CMP applications are described in U.S. Pat. No. 5,527,423 to Neville et al., U.S. Pat. No. 5,354,490 to Yu et al., U.S. Pat. No. 5,157,876 to Medellin, U.S. Pat. No. 5,137,544 to Medellin, and U.S. Pat. No. 4,956,313 to Cote et al.

There are various mechanisms disclosed in the prior art by which metal surfaces can be polished with slurries. The metal surface may be polished using a slurry in which a surface film is not formed in which case the process proceeds by mechanical removal of metal particles and their dissolution in the slurry. In such a mechanism, the chemical dissolution rate should be slow in order to avoid wet etching. A more preferred mechanism is, however, one where a thin abradable layer is continuously formed by reaction between the metal surface and one or more components in the slurry such as a complexing agent, an oxidizing agent, and/or a film forming agent. The thin abradable layer is then removed in a controlled manner by mechanical action. Once the mechanical polishing process has stopped a thin passive film remains on the surface and controls the wet etching process. In most cases, however, chemical mechanical polishing proceeds by some combination of these two mechanisms. Mechanical action can remove not only the surface film but also the metal underneath, with metal dissolution and passivation providing a needed control for the overall process: small metal particles are preferentially dissolved in the slurry, while some passivation of the remaining surface gives protection to the patterned metal against excessive dishing.

Ta and TaN are chemically very passive and mechanically very hard and thus difficult to remove by polishing. The use of a single slurry, which performs with a high Cu:Ta selectivity may demand prolonged polishing times for Ta, i.e., significant over polishing times for copper, during which there is significant dishing and erosion. As a result, there remains a need for CMP compositions and slurries that can be used successfully to polish multiple layer substrates at high rates and selectivities. There also remains a need for CMP compositions and slurries that can polish multiple substrate layers at similar or dissimilar rates and selectivites in order to improve planarization.

SUMMARY OF THE INVENTION

The present invention is directed to alpha-amino acid containing chemical mechanical polishing systems that include chemical mechanical polishing compositions, slurries, and methods for polishing one or more metal and dielectric layers associated with electrical substrates at high rates with low defectivity. The alpha-amino acid is represented by the formula $H_2N$—$CR_1R_2COOH$, wherein $R_1$ and $R_2$ are not both hydrogen and wherein $R_1$ and $R_2$ are each individually selected from the group of hydrogen, branched, cyclic and straight chain, moieties having from 1 to 8 carbon atoms that are unsubstituted or substituted with one or more substituents selected from nitrogen containing substituents, oxygen containing substituents, sulfur containing substituents and mixtures thereof. In addition, the chemical mechanical polishing system may include a polishing pad that cooperates with the chemical mechanical polishing compositions to polish a substrate. In one embodiment, the polishing pad does not include abrasive particles embedded therein. In another embodiment, the polishing pad includes abrasive particles embedded therein.

The present invention is also directed to chemical mechanical polishing compositions including from about 0.05 to about 10.0 wt % hydrogen peroxide, and from about 0.1 to about 10.0 wt % alanine with or without from about 0.1 to about 30.0 wt % of alumina.

The present invention is further directed to chemical mechanical polishing compositions comprising from about 0.05 to about 10.0 wt % of at least one oxidizing agent, from about 0.1 to about 10.0 wt % of alanine, and from about 0.01 to about 5.0 wt % of at least one nitrogen containing compound that inhibits the ability of the chemical mechanical polishing composition to polish at least one layer associated with the substrate. Because the at least one nitrogen containing compound inhibits the ability of the chemical mechanical polishing composition to polish substrate layers, it is referred to as a stopping compound. Although the stopping compound has been shown as being cationically charged, this is not a limitation of the present invention. The chemical mechanical polishing composition may or may not contain an abrasive.

This invention is also directed to methods for polishing substrates including a first metal layer and a second layer located below the first metal layer. The method includes applying a chemical mechanical polishing composition to the first metal layer of the substrate, wherein the chemical mechanical polishing composition includes an oxidizing agent and at least one alpha-amino acid having the formula $H_2N$—$CR_1R_2COOH$, wherein $R_1$ and $R_2$ are not both hydrogen and wherein $R_1$ and $R_2$ are each individually selected from the group of hydrogen, and cyclic, branched, and straight chain moieties having from 1 to 8 carbon atoms that are unsubstituted or substituted with one or more substituents selected from nitrogen containing substituents, oxygen containing substituents, sulfur containing substituents and mixtures. Once applied, the first metal layer is polished with the chemical mechanical polishing composition until at least a portion of the first metal layer is removed from the substrate to expose the second layer to form a partially polished substrate. The compositions of this invention may be used to polish a subsequent substrate layer or a second polishing composition can be used to polish subsequent substrate material layers.

DESCRIPTION OF THE CURRENT EMBODIMENT

The present invention relates to alpha-amino acid containing chemical mechanical polishing systems that include chemical mechanical polishing compositions and slurries, and to methods for using the compositions and slurries of this invention to polish substrates including one or more metal layers and, optionally, one or more dielectric layers.

Before describing the details of the various preferred embodiments of this invention, some of the terms that are used herein will be defined. The chemical mechanical polishing ("CMP") composition is a useful product of this invention that comprises an oxidizer, a polishing additive of alpha-amino acid and other ingredients, which other ingredients are optional. The CMP composition is useful for polishing a substrate having multiple layers of metal disposed thereon, referred to herein as an "electrical substrate," which includes but is not limited to semiconductor thin-films, integrated circuit thin-films, and any other films and surfaces where CMP processes are useful.

The terms "copper" and "copper containing alloys" are used interchangeably herein as it is within the understanding of one of skill in the art that the terms include but are not limited to substrates comprising layers of pure copper, copper aluminum alloys, and Cu/TiN/Ti, and Cu/TaN/Ta multi-layer substrates.

The terms "tantalum" and "tantalum containing alloys" are used interchangeably herein to refer to the tantalum and/or tantalum nitride adhesion layers under the conductive layer such as a conductive copper layer.

Polishing compositions of this invention may be combined with at least one abrasive to give a chemical mechanical polishing slurry that is useful for polishing substrates. Alternatively, the polishing compositions disclosed herein are also useful in conjunction with an abrasive containing pad or an abrasive free pad to polish metal layers, adhesion layers and dielectric layers associated with substrates. Examples of abrasive pads that may be used with polishing compositions of this invention are disclosed in U.S. Pat. Nos. 5,849,051 and 5,849,052 the specifications of which are incorporated herein by reference. Where the context so dictates, the terms CMP compositions and CMP slurries may be used interchangeably in the spirit of the present invention.

The polishing systems, including compositions and slurries, of this invention each include at least one oxidizing agent. The oxidizing agent aids in oxidizing the substrate metal layer or layers to their corresponding oxide, hydroxide, or ions. For example, the oxidizing agent may be used to oxidize titanium to titanium oxide, tungsten to tungsten oxide, copper to copper oxide, and aluminum to aluminum oxide. The oxidizing agent is useful when incorporated into a CMP system to polish metals and metal based components including titanium, titanium nitride, tantalum, tantalum nitride, copper, tungsten, tungsten nitride, aluminum, aluminum alloys such as aluminum/copper alloys, gold, silver, platinum, ruthenium, and various mixtures and combinations thereof by mechanical polishing methods.

A wide range of oxidizing agents may be used in the CMP systems of this invention. Suitable oxidizing agents include one or more inorganic and organic per-compounds as well as compounds containing an element in its higher or highest oxidation state.

A per-compound is a compound containing at least one peroxy group (—O—O—). Examples of compounds containing at least one peroxy group include, but are not limited to, hydrogen peroxide and its adducts such as urea hydrogen peroxide and percarbonates, organic peroxides such as benzyl peroxide, peracetic acid, and di-t-butyl peroxide, monopersulfates ($SO_5^=$), dipersulfates ($S_2O_8^=$), sodium peroxide, and mixtures thereof.

Examples of oxidizing agents containing an element in its higher oxidation state include, but are not limited to, bromic acid, bromate salts, chloric acid, chlorate salts, chromate salts, iodic acid, iodate salts, periodic acid, periodate salts, perbromic acid, perbromate salts, perchloric acid, perchlorate salts, perboric acid, perborate salts, permanganate salts, cerium (IV) compounds such as ammonium cerium nitrate, iron salts such as nitrates, sulfates, EDTA, and citrates, potassium ferricyanide, vanadium trioxide and the like, and aluminum salts.

Preferred oxidizing agents are peracetic acid, urea-hydrogen peroxide, hydrogen peroxide, monopersulfuric acid, dipersulfuric acid, salts thereof, and mixtures thereof. A most preferred oxidizing agent is hydrogen peroxide.

The oxidizing agent may be present in the chemical mechanical polishing systems in an amount ranging from about 0.01 to about 30.0 weight percent. It is preferred that the oxidizing agent is present in the CMP systems of this invention in an amount ranging from about 0.1 to about 17.0 weight percent and most preferably from about 0.5 to about 10.0 weight percent.

The CMP systems, including compositions and slurries, of this invention may include ingredients that form a passivation layer on the surface of an electrical substrate layer. Once a passivation layer is formed, it becomes important to be able to disturb the passivation layer in order to obtain a desirable polishing rate. The chemical mechanical polishing systems of the present invention include a polishing additive of alpha-amino acid to increase the metal polishing rates. The alpha-amino acids is represented by the formula $H_2N$—$CR_1R_2COOH$, wherein $R_1$ and $R_2$ are not both hydrogen and wherein $R_1$ and $R_2$ are each individually selected from the group of hydrogen, and cyclic, branched and straight chain moieties having from 1 to 8 carbon atoms that are unsubstituted or substituted with one or more substituents selected from nitrogen containing substituents, oxygen containing substituents and sulfur containing substituents including but not limited to —COOH, —CONH$_2$, —NH$_2$, —S—, —OH, —SH, and mixtures thereof. More preferably, the alpha-amino acid is selected from the group consisting of alanine, arginine, asparagine, aspartic acid, cystine, cysteine, glutamine, glutamic acid, histidine, isoleucine, leucine, lysine, methionine, phenylalanine, serine, threonine, tryptophan, tyrosine, valine, and mixtures thereof. Most preferably, the polishing additive is alanine.

The polishing additive of alpha-amino acid is included in the compositions and slurries of this invention in an amount ranging from about 0.05 to about 10.0 wt %. It is more preferred that the polishing additive be present in the compositions of this invention in an amount ranging from about 0.3 to about 5.0 wt %.

The chemical mechanical polishing systems, including compositions or slurries, of the present invention may include one or more optional ingredients that improve or enhance the performance of the compositions and slurries of this invention. Some examples of useful optional ingredients include passivation film forming agents, dispersants, surfactants, polishing stopping compounds, stabilizers, abrasives, and any other optional ingredients that are known to those of skill in the art to promote and control CMP polishing.

The systems of this invention may include one or more stopping compounds. The stopping compounds interact with a metal layer, an adhesion layer, and/or a dielectric layer and essentially stop the polishing action of the chemical mechanical polishing composition or slurry. The result is that the chemical mechanical polishing composition or slurry polishes a layer associated with a substrate and is essentially stopped from polishing a second layer that lies below the layer that has been polished, e.g., the first layer. The stopping compound may be any compound capable of adsorbing onto the second layer and inhibiting its removal. The term "essentially stopped" as used herein means that the polishing composition or slurry has a first layer to second layer polishing selectivity of about 30:1, preferably at least 50:1 and most preferably at least 100:1.

Preferred stopping compounds are oppositely charged from the surface charge of the layer whose polishing is being inhibited. A preferred class of stopping compounds includes cationically charged nitrogen containing compounds. By "cationically charged" it is meant that the stopping compound is in cationic form at the operating pH of the CMP composition or slurry. Preferably the layer being polished is a metal layer, e.g., a tantalum layer, and the layer underneath the layer being polished is another metal layer, an adhesion layer, or a dielectric layer.

A preferred class of stopping compounds includes nitrogen containing stopping compounds such as primary, secondary, tertiary and quaternary amines, oligomeric, and polymeric amines, imines, amides, imides, amino acids, amino alcohols, and etheramines. A more preferred class of nitrogen containing stopping compounds include polyethylenimines having molecular weights ranging from about 200 to over a million; $N_4$-amin(N,N'-bis-[3-aminopropyl] ethylene diamine); 4,7,10-trioxatridecane-1,13-diamine; 3,3-dimethyl-4,4-diaminodicyclohexylmethane; 2-phenylethylamine; polyetheramine; etheramines; N,N-dimethyldipropylenetriamine; 3-[2-methoxyethoxy] propylamine; dimethylaminopropylamine; 1,4-bis(3-amino propyl)piperazine; lysine; isophorone diamine; hexamethyl-enediamine; N-cyclohexyl-1,3-propanediamine; N-(3-aminopropyl)-1,3-propanediamine; tetraethylenepentamine; N,N,N',N'-tetramethyl-1,4-butanediamine; propylamine; 2-(2-aminoethoxy)ethanol; 1,3-diamino-2-propanol; thiomicamine; 2-amino-1-butanol; poly[bis(2-chloroether)-alt-1,3-bis(3-dimethylamino)propyl]; and mixtures thereof.

In general, the amount of stopping compounds used in CMP compositions and slurries of this invention will range from about 0.001 to about 5.0 weight percent, and preferably from about 0.05 to about 3.0 weight percent. Furthermore, the stopping compounds may be added directly to the composition or treated onto the surface of the metal oxide abrasive using known techniques. In either case, the amount of additive is adjusted to achieve the desired concentration in the polishing composition. A final choice of the preferred stopping compound depends also on its chemical stability, interaction (or lack thereof) with other components of the slurry and its effect on the colloidal stability of any abrasive particles employed.

The CMP systems of the present invention may further include an optional passivation film forming agent. The film forming agent may be any compound or combination of compounds that are capable of facilitating the formation of a passivation layer of metals and dissolution-inhibiting layers on the surface of a metal layer. Passivation of the substrate metal surface layer is important to prevent metal surface wet etching. Useful passivation film forming agents are nitrogen containing heterocyclic compounds wherein the nitrogen containing heterocycle comprises a portion to all of the compound. Preferred heterocyclic passivation film forming agents include compositions containing 5 and 6 member heterocyclic rings with nitrogen being a part of the ring. Examples of such nitrogen containing 5 and 6 member ring compounds include 1,2,3-triazole, 1,2,4-triazole, benzotriazole, benzimidazole and benzothiazole and their derivatives with hydroxy, amino, imino, carboxy, mercapto, nitro and alkyl substituted groups, as well as urea, thiourea and others. Preferred etch inhibitors are benzotriazole ("BTA"), 1,2,3-triazole, 1,2,4-triazole, and mixtures thereof.

The optional passivation film forming agents should be present in CMP compositions of this invention in an amount ranging from about 0.005 to about 1.0 weight percent. It is preferred that passivation film forming agents be present in the CMP compositions and slurries in an amount ranging from about 0.01 to about 0.2 weight percent. It should be noted that passivation film forming agents are also referred to as etch inhibitors.

Mechanical abrasion during the CMP process can be achieved using an abrasive containing slurry in combination with a polishing pad, using an abrasive-free slurry in combination with a polishing pad having an abrasive embedded therein, or using an abrasive-free slurry in combination with a polishing pad that does not have an abrasive embedded therein. The chemical mechanical polishing compositions and slurries of this invention may include an abrasive. The abrasive is typically a metal oxide abrasive. The metal oxide abrasive may be selected from the group including alumina, titania, zirconia, germania, silica, ceria and mixtures thereof. The CMP slurries of this invention preferably each include from about 0.1 to about 30.0 weight percent or more of an abrasive. It is more preferred, however, that the slurries of this invention include from about 0.5 to about 10.0 weight percent abrasive.

Preferably, the metal oxide abrasive is incorporated into the aqueous medium of the polishing slurry as a concentrated aqueous dispersion of metal oxides, comprising from about 3% to about 45% solids, and more preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

The CMP compositions and slurries of this invention may be produced using conventional techniques known to those skilled in the art. Typically, the oxidizing agent and other non-abrasive components, are mixed into an aqueous medium, such as deionized or distilled water, at predetermined concentrations under shear conditions until such components are completely dissolved in the medium. Optionally, a concentrated dispersion of metal oxide abrasive, such as fumed alumina, may be added to the medium and diluted to the desired loading level of abrasive and all other components in a final CMP slurry.

The CMP compositions and slurries of the present invention may be supplied as a one package system including all of the slurry additives. Due to concerns about shipping CMP slurries containing oxidizing agents, and especially hydrogen peroxide, it is preferred that the CMP compositions and slurries of this invention be prepared and packaged as a CMP precursor containing every ingredient except the oxidizing agent or agents.

If the compositions of this invention exhibit a polishing rate ratio of the first metal layer, i.e., a conductive layer, to the underlying adhesive layer that is less than 30, the polishing composition of this invention may be used in a single step to polish both the conductive and adhesive layers. For example, if the conductive layer is copper and the underlying adhesive layer is a tantalum containing material and the polishing rate ratio is less than 30, both the copper and the tantalum containing material can be polished using the same chemical mechanical polishing composition, i.e., a single step can be used to perform the polishing. If, on the other hand, the polishing rate ratio is greater than 30, the use of the compositions or slurries of this invention to polish multiple layers would demand prolonged polishing times for the adhesion layer and thus, significant overpolishing times for the first metal layer during which there is significant dishing and erosion, i.e., a there is a degradation of dishing and erosion performance. In that case there is a need for two or more CMP compositions, slurries, or combination thereof that can be used successfully to polish multiple layer substrates and particularly substrates including copper and tantalum.

The substrates polished by the compositions and slurries of this invention will typically include a metal layer that covers one or more adhesion layers which in turn cover an oxide layer. The oxide layer can be placed upon a second metal layer and so forth to give a built up substrate. The compositions and slurries of this invention are useful for polishing one or a combination of the layers comprising the substrates. For example, a polishing composition of this invention may be used to polish the metal layer after which the polishing composition or slurry is removed from the substrate and a second polishing composition or slurry of this invention or not of this invention is applied to the adhesion and/or dielectric layer of the substrate to polish the second and optionally subsequent substrate layers. Alternatively, a first polishing composition or slurry may be used to polish the conductive or metal layer, a second composition or slurry may be used to polish the adhesion layer, and a third composition or slurry may be used to polish the dielectric layer. In another alternative embodiment, a polishing composition or slurry of this invention can be selected to polish two or more of the layers without the need to remove the polishing composition or slurry from the substrate.

When two or more polishing compositions or slurries are used to polish a substrate, the compositions or slurries of this invention will generally be the first polishing composition or slurry and should have a high metal-layer to adhesion/dielectric-layer selectivity while the second polishing composition or slurry should have a low metal-layer to adhesion/dielectric-layer selectivity. For example, the chemical mechanical polishing compositions or slurries of this invention can include polishing additives and other ingredients that allow the polishing composition or slurry to polish copper at a high rate while exhibiting a low polishing rate towards tantalum and other adhesion, dielectric or metal layers. The polishing composition or slurry is removed from the substrate once polishing of the copper layer is complete. A second chemical mechanical polishing composition or slurry including polishing additives that allow the polishing composition to polish copper at a lower rate while exhibiting a higher polishing rate towards tantalum or other adhesion, dielectric, or metal layers can then be applied to the partially polished substrate. This invention contemplates the selection of one or more polishing additives to tailor the ability of the resulting chemical mechanical polishing composition or slurry to polish specific metal, adhesion, or oxide layers at the high or low rate desired.

When used to polish a substrate, the chemical mechanical polishing compositions of this invention are applied to the substrate and the substrate is polished by conventional means using polishing machines and a polishing pad. As set forth above, an abrasive may be incorporated into the polishing composition to form a polishing slurry, may be incorporated into or embedded on the polishing pad, or both. When substrate polishing using the compositions or slurries of this invention is complete, the substrate may be washed with deionized water or other solvents to remove the polishing composition or slurry from the partially polished substrate. Next, a second polishing composition or slurry may be applied to the substrate and the substrate is polished using conventional techniques in order to preferentially polish the tantalum or tantalum nitride portion relative to the copper portion of the partially polished substrate. Once the second polishing step is complete, the second polishing composition or slurry is washed from the substrate with deionized water or another solvent and the substrate is ready for further processing.

In both polishing steps, the polishing compositions or slurries may be applied directly to the substrate, to a polishing pad, or to both in a controlled manner during substrate polishing. It is preferred however that polishing compositions be applied to the pad, which pad thereafter is placed against the substrate after which the pad is moved in relationship to the substrate in order to achieve substrate polishing.

The polishing compositions of this invention are especially useful for polishing substrates including copper, titanium, titanium nitride, tantalum, tantalum nitride, tungsten, and tungsten nitride layers at good rates under controllable conditions. The polishing slurries of the present invention may be used during the various stages of semiconductor integrated circuit manufacture to provide effective polishing at desired polishing rates while minimizing surface imperfections and defects.

EXAMPLE 1

This example compares the performance of a polishing slurry that includes glycine with a polishing slurry in accordance with this invention that includes alanine as the alpha-amino acid. The polishing slurries included 3.0 wt % alumina, 2.0 wt % hydrogen peroxide along with the ingredients reported in Table 1, below. The alumina was in the form of Semi-Sperse® W-A355 polishing slurry manufactured by Cabot Microelectronics Corporation, Aurora, Ill. The composition polishing results are also reported in Table 1.

All the polishing was done on an IPEC 472 polisher with a perforated Rodel IC-1000 pad stacked on a Suba IV pad. The polishing tool parameters were: a Down Force of 3 psi, a Platen Speed of 55 rpm, and a Carrier Speed of 30 rpm.

TABLE 1

| Slurry Composition | Cu rate Å/min | Ta rate Å/min | oxide rate Å/min | Cu dishing Å 10 µm | Cu dishing Å 50 µm | oxide erosion 0.5 × 1.0 µm array | oxide erosion 2.0 × 4.0 µm array | line recess Å 0.5 × 1.0 µm array | roughness on Cu, Å |
|---|---|---|---|---|---|---|---|---|---|
| 0.15 molarity alanine, 0.06% Lupasol SKA*, 0.04% triazole, pH 4.8 | 2501 | 11 | 2 | 1588 | 3094 | 251 | 303 | 480 | 19 |
| 0.15 molarity glycine, 0.06% Lupasol SKA*, 0.04% triazole, pH 4.8 | 5442 | 8 | 2 | 2153 | 4360 | 383 | 607 | 910 | 30 |

*Lupasol SKA: polyethylenimine (2 million average molecular weight) manufactured by BASF.

The above table shows the performance comparison of dishing, erosion and Cu line recess of alanine and glycine based slurries with everything else in the slurries being identical. The results demonstrate the unique nature and capability of alanine in significantly minimizing dishing, erosion, line recess, as well as Cu surface roughness in a Cu CMP process. The performance difference is believed to be due to the difference in the molecular structures of alanine and glycine. Alanine, with its extra methyl group is believed to complex copper at a slower rate than glycine. This unique feature of alanine and other substituted amino acids results in a polishing process that is easier to control.

EXAMPLE 2

A number of polishing tests were conducted to demonstrate the effects of alpha-amino acid containing polishing compounds on the copper removal rates. The abrasive used in the polishing was alumina at 3% solid levels, prepared from Semi-Sperse® W-A355, a polishing slurry by Cabot Microelectronics Corporation. Polishing was performed using the same materials, equipment and conditions described in Example 1.

TABLE 2

Effects of α-amino acid-containing additives on polishing rate of copper in slurries with 3% alumina and 2.5% hydrogen peroxide

| | Chemistry | Cu rate Å/min | Ta rate Å/min |
|---|---|---|---|
| 1 | 0.5% α-alanine, pH 7.7 | 2961 | 288 |
| 2 | 0.6% D,L-aspartic acid, pH 7.7 | 3807 | 448 |
| 3 | 1% D,L-methionine, pH 7.7 $CH_3SCH_2CH_2CH(NH_2)COOH$ | 3161 | 149 |

Compositions 1 and 2 remove Cu and/or Ta and can be used as a single step polishing composition. Composition 3 removes Cu at a much higher rate than Ta and may be useful as a first stage polishing composition.

EXAMPLE 3

In addition to polishing tests demonstrating the effects of alpha-amino acid containing polishing compounds on the copper removal rates, the effects of a beta-amino acid on copper removal rates were evaluated. The abrasive used in the polishing was alumina at 3% solid levels, prepared from Semi-Sperse® W-A355, a polishing slurry by Cabot Microelectronics Corporation, Aurora, Ill. Polishing was performed using the same materials, equipment and conditions described in Examples 1 and 2.

TABLE 3

Comparison of α-amino acid and β-amino acid-containing additives on polishing rate of copper in slurries with 3% alumina, 0.03% triazole, 0.06% Lupasol SKA, 1.0% hydrogen peroxide, and pH 7.5

|   | Chemistry | Cu rate Å/min | Ta rate Å/min |
|---|---|---|---|
| 1 | 1.0% α-alanine | 2784 | 11 |
| 2 | 1.0% β-alanine | 986 | 13 |

The composition containing α-alanine removes copper at rate approximately 2.8 times greater than the composition containing β-alanine.

EXAMPLE 4

A single slurry was tested in this Example using a Mirra polishing tool (from Applied Materials) and a two phase polishing process, with the first phase having an MP (Carrier Membrane Pressure) of 4 psi (lbs. per square inch), an IP (Carrier Intertube Pressure) of 4 psi, an RRP (Carrier Retaining Ring Pressure) of 5 psi, a PS (Platen Speed) of 43 rpm and a CS (Carrier Speed) of 37 rpm, and with the second phase having MP/IP/RRP/PS and CS of 2/2/3/103/97, respectively. The slurry included 0.6 wt % alanine, 0.06 wt % Lupasol SKA, 0.04 wt % 1,2,4, triazole, 1 wt % $H_2O_2$ and 3 wt % alumina. The slurry pH was 7.7. The polishing slurry was able to remove copper from a Cu/Ta wafer at a rate of 4101 Å per minute. The wafer dishing at a 10 μm feature size was 613 Å and at a 50 μm feature size was 913. The erosion for an array having a 0.5 μm line and a 1 μm pitch, i.e., a 0.05/1.0 μm array, was 190 Å.

What we claim is:

1. A chemical mechanical polishing system comprising:
   at least one oxidizing agent;
   at least one passivation film forming agent;
   at least one stopping compound that is selected from the group of compounds consisting of $N_4$-amine (N,N'-bis-[3-aminopropyl]ethylene diamine), 4,7,10-trioxitridecane-1,13-diamine, 3,3-dimethyl-4,4-diaminodicyclohexylmethane, 2-phenylethylamine, polyetheramines, etheramines, N,N-dimethyldipropylenetriamine, 3-[2-methoxyethoxy] propylamine, dimethylaminopropylamine, 1,4-bis(3-amino propyl)piperazine and mixtures thereof; and alanine wherein the polishing system pH ranges from 4.8 to 7.7.

2. The chemical mechanical polishing composition of claim 1 including from about 0.5 to about 10.0 wt % of oxidizing agent.

3. The chemical mechanical polishing system of claim 1 wherein the at least one oxidizing agent is hydrogen peroxide.

4. The chemical mechanical polishing composition of claim 1 wherein the composition includes at least one passivation film forming agent that includes at least one organic heterocycle having from 5 to 6 member heterocycle rings as the active functional group wherein at least one ring includes a nitrogen atom.

5. The chemical mechanical polishing composition of claim 4 wherein the passivation film forming agent is selected from benzotriazole, triazole, benzimidizole and mixtures thereof.

6. The chemical mechanical polishing system of claim 1 wherein the at least one passivation film forming agent is at least one organic heterocycle having from 5 to 6 member heterocycle rings as the active functional group wherein at least one ring includes a nitrogen atom.

7. The chemical mechanical polishing system of claim 1 further including at least one metal oxide abrasive.

8. The chemical mechanical polishing composition of claim 7 including from about 0.1 to about 30.0 wt % of alumina.

9. The chemical mechanical polishing system of claim 7 wherein the metal oxide abrasive is from about 0.1 to about 30.0 wt % of alumina.

10. The chemical mechanical polishing system of claim 1 further including a polishing pad.

11. The chemical mechanical polishing composition of claim 10 including from about 0.1 to about 30.0 wt % of at least one abrasive.

12. The chemical mechanical polishing composition of claim 1 including from about 0.1 to about 17.0 wt % of oxidizing agent.

* * * * *